United States Patent
Dogome et al.

(10) Patent No.: US 10,133,266 B2
(45) Date of Patent: Nov. 20, 2018

(54) CONVEYANCE ROBOT REPLACEMENT APPARATUS AND CONVEYANCE ROBOT REPLACEMENT METHOD

(71) Applicant: TOKYO ELECTRON LIMITED, Tokyo (JP)

(72) Inventors: Masahiro Dogome, Miyagi (JP); Hiroshi Ikari, Miyagi (JP); Toshiaki Toyomaki, Miyagi (JP); Genichi Nanasaki, Miyagi (JP); Takehiro Shindo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 678 days.

(21) Appl. No.: 14/794,893

(22) Filed: Jul. 9, 2015

(65) Prior Publication Data
US 2016/0011587 A1 Jan. 14, 2016

(30) Foreign Application Priority Data
Jul. 10, 2014 (JP) ................................. 2014-142251

(51) Int. Cl.
*B25J 11/00* (2006.01)
*B25J 19/00* (2006.01)
(Continued)

(52) U.S. Cl.
CPC ....... *G05B 19/4189* (2013.01); *B25J 11/0095* (2013.01); *B25J 19/0066* (2013.01); *H01L 21/67766* (2013.01); *B25J 21/00* (2013.01); *B65G 47/91* (2013.01); *G05B 2219/45031* (2013.01); *G05B 2219/45054* (2013.01); *H01L 21/68* (2013.01); *Y02P 90/083* (2015.11); *Y02P 90/28* (2015.11)

(58) Field of Classification Search
CPC .... B25J 11/0095; B25J 19/0066; H01L 21/68
See application file for complete search history.

(56) References Cited

U.S. PATENT DOCUMENTS 6,401,554 B1 * 6/2002 Mori ................. H01L 21/67288
73/1.81

FOREIGN PATENT DOCUMENTS

| JP | 62212705 A | * | 9/1987 | .......... B25J 19/0066 |
| JP | 2002-313873 A | | 10/2002 | |

* cited by examiner

*Primary Examiner* — George C Neurauter, Jr.
(74) *Attorney, Agent, or Firm* — Rothwell, Figg, Ernst & Manbeck, P.C.

(57) ABSTRACT

Provided is a conveyance robot replacement apparatus used for replacing a conveyance robot installed in an atmosphere conveyance chamber of a semiconductor manufacturing apparatus in order to convey a substrate. The conveyance robot replacement apparatus includes a positioning unit configured to determine a position of the conveyance robot replacement apparatus with respect to the atmospheric conveyance chamber, a holding unit configured to suspend the conveyance robot to be supported, a guide portion configured to guide advancing and retreating into and from the atmospheric conveyance chamber of the holding unit by being engaged with the positioning unit, a position adjustment unit configured move the holding unit in each of the longitudinal direction, the horizontal direction, and the vertical direction to adjust a position of the holding unit, and a connecting component connectable to the holding unit as well as the conveyance robot.

11 Claims, 11 Drawing Sheets

(51) Int. Cl.
*G05B 19/418* (2006.01)
*H01L 21/677* (2006.01)
*B65G 47/91* (2006.01)
*H01L 21/68* (2006.01)
*B25J 21/00* (2006.01)

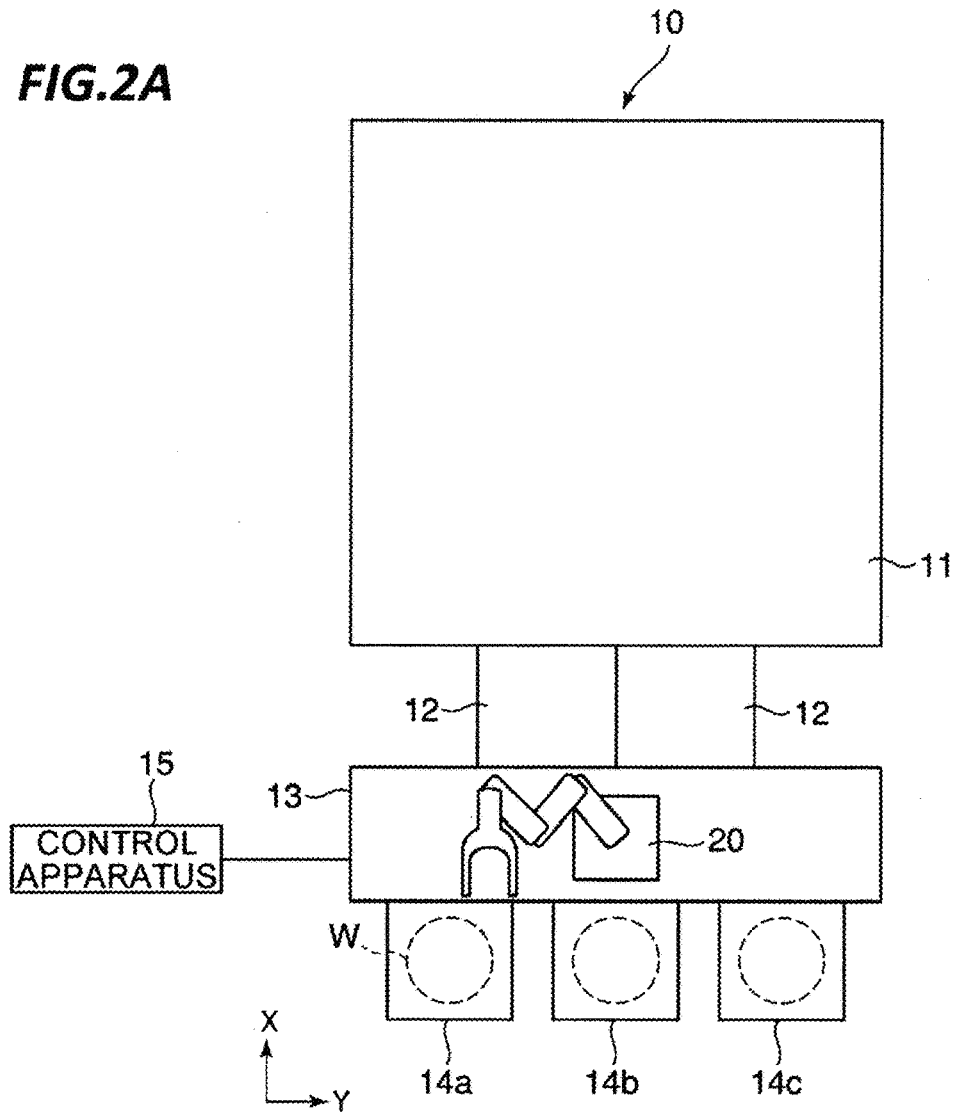
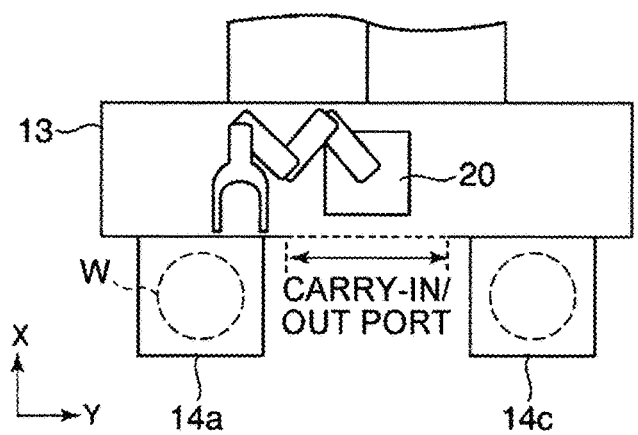

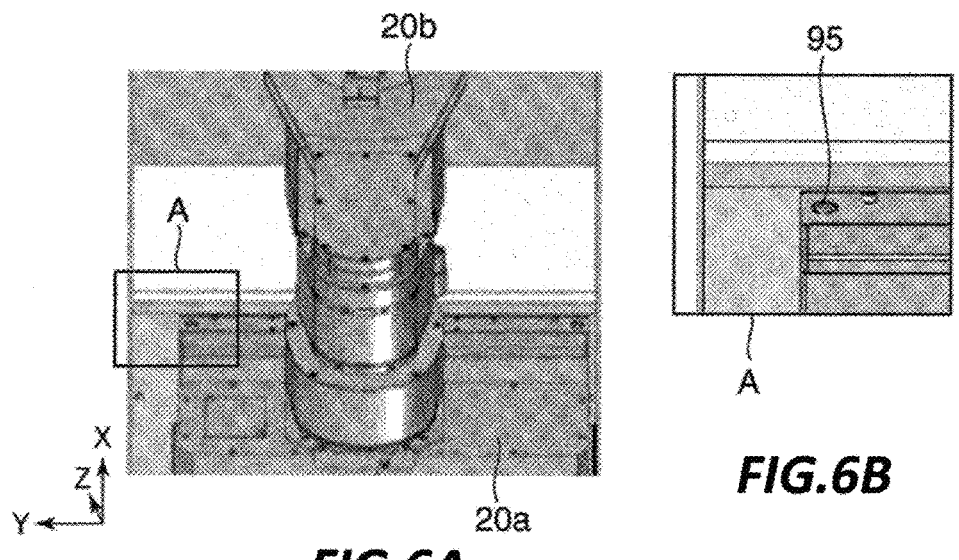
FIG.6A
FIG.6B
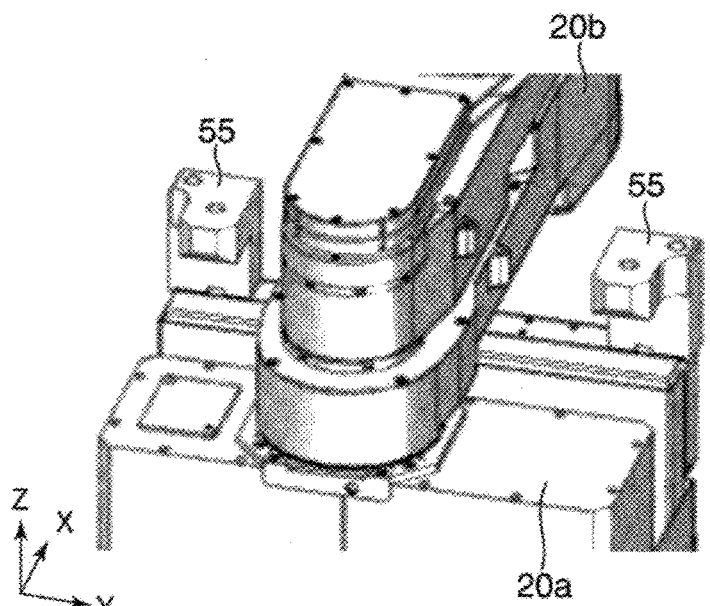
FIG.6C

CONVEYANCE ROBOT REPLACEMENT APPARATUS AND CONVEYANCE ROBOT REPLACEMENT METHOD

CROSS-REFERENCE TO RELATED APPLICATIONS

This application is based on and claims priority from Japanese Patent Application No. 2014-142251, filed on Jul. 10, 2014, with the Japan Patent Office, the disclosure of which is incorporated herein in its entirety by reference.

TECHNICAL FIELD

The present disclosure relates to a conveyance robot replacement apparatus and a conveyance robot replacement method that replace a conveyance robot conveying a processing target object in a processing apparatus which performs a predetermined processing on the processing target object.

BACKGROUND

For example, a semiconductor manufacturing apparatus performing a predetermined processing such as, for example, a cleaning processing, a film forming processing, or an etching processing on a semiconductor wafer includes a processing unit performing a predetermined processing on the semiconductor wafer, a load port in which a container accommodating a plurality of semiconductor wafers is placed, and a loader module for conveying the semiconductor wafer between the container placed in the load port and the processing unit.

A conveyance robot for conveying the semiconductor wafer is installed in the loader module, and the conveyance robot is carried out of the loader module for maintenance after the semiconductor manufacturing apparatus has been operated for a predetermined period of time, or for repairs when a fault has occurred. Also, when a long period of time is required for the inspection or repairs of the carried out conveyance apparatus, another conveyance robot is installed in the loader module. When the inspection or repairs for the carried out conveyance apparatus is finished in a short period of time, the conveyance robot for which the inspection or repairs is finished is installed again in the loader module, and the semiconductor manufacturing apparatus is operated again.

There has been known a method for replacing a conveyance robot by lifting/suspending it using a wire or chain as a method for replacing a conveyance robot installed in a loader module. Further, there has been suggested a method in which a lifting fork portion of a hand lifter is inserted into a predetermined position of a conveyance robot installed within a loader module and the lifting fork portion is moved up to raise the conveyance robot, and the lifting fork portion is retreated from the loader module to draw the conveyance robot out of the loader module. See, for example, Japanese Laid-Open Patent Publication No. 2002-313873.

SUMMARY

A conveyance robot replacement apparatus of the present disclosure is used for replacing a conveyance robot installed in an atmospheric conveyance chamber of a semiconductor manufacturing apparatus in order to convey a substrate. The conveyance robot replacement apparatus includes a positioning unit configured to perform positioning of the conveyance robot replacement apparatus with respect to the atmospheric conveyance chamber, a holding unit configured to suspend and support the conveyance robot, a guide portion configured to guide a back and forth movement with respect to the atmospheric conveyance chamber of the holding unit by being engaged with the positioning unit, a position adjustment unit configured to move the holding unit in each of longitudinal, horizontal, and vertical directions to adjust a position of the holding unit, and a connecting component configured to be connectable to the holding unit as well as to the conveyance robot. In the conveyance robot replacement apparatus, the connecting component attached to the conveyance robot is connected with a tip end of the holding unit such that the holding unit suspends and supports the conveyance robot.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 2A and 2B are plan views illustrating a schematic configuration of the semiconductor manufacturing apparatus of FIG. 1.

FIGS. 6A to 6C are views for explaining a method of attaching a first component to a conveyance robot of at step S102 of FIG. 5.

DETAILED DESCRIPTION

Figure 1:
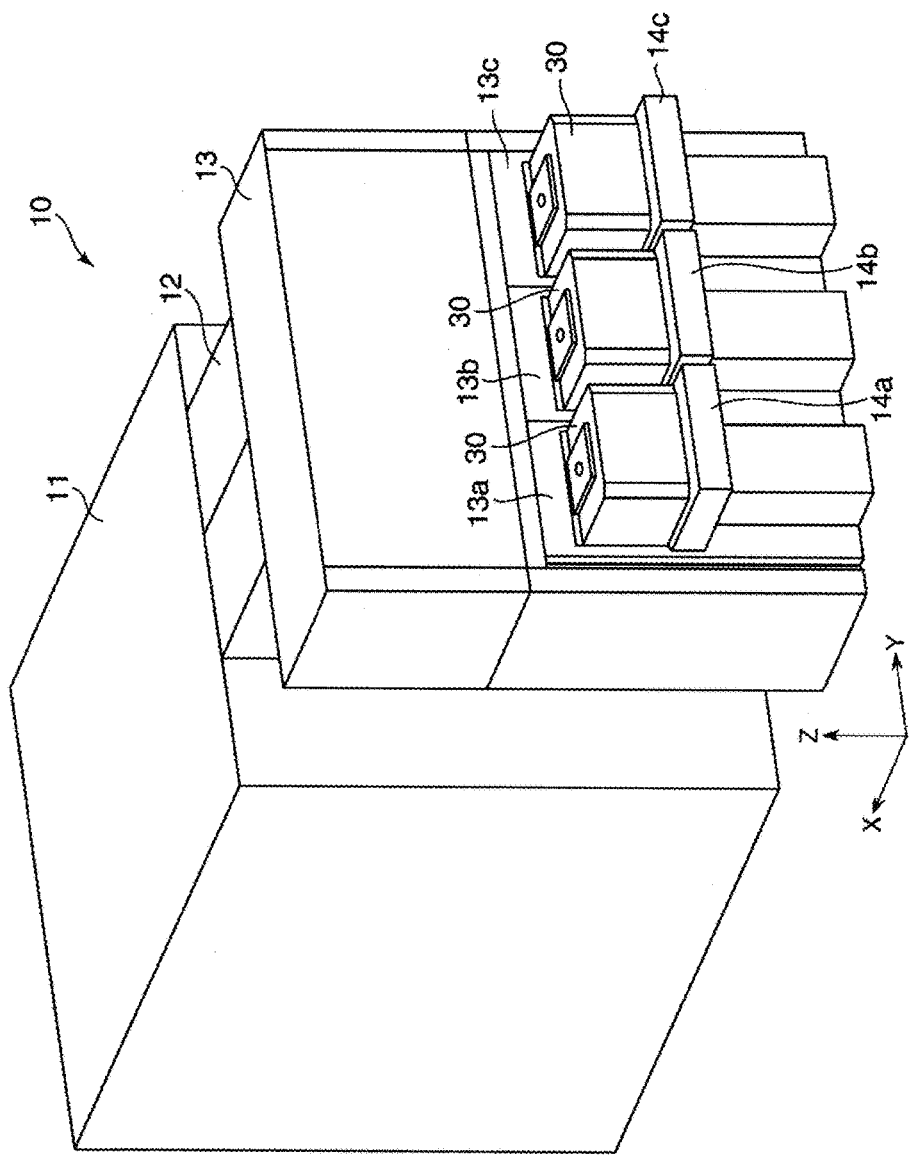
FIG. 1 is a perspective view illustrating a schematic configuration of a semiconductor manufacturing apparatus compatible with a conveyance robot replacement apparatus according to an exemplary embodiment of the present disclosure.

In the following detailed description, reference is made to the accompanying drawings, which form a part hereof. The illustrative embodiments described in the detailed description, drawing, and claims are not meant to be limiting. Other exemplary embodiments may be utilized, and other changes may be made without departing from the spirit or scope of the subject matter presented here.

A conveyance robot is a heavy object. Therefore, in a method of carrying in/out the conveyance robot by lifting/suspending the conveyance robot using a wire or chain, there is a concern that since the conveyance robot is moved in a very unstable condition, the conveyance robot sways and collides with a wall portion or frame portion during work such that the conveyance robot or the wall portion of the loader module may be broken. Further, the conveyance robot may be dropped.

In the meantime, even in a method for conveying the conveyance robot using the hand lifter, the conveyance robot is conveyed in a state where the lifting fork portion is simply inserted into a predetermined portion of the conveyance robot to pull up the conveyance robot and the conveyance robot is only held and raised by the lifting fork portion in the related art. Accordingly, there is a problem that a scratch or the like may be caused in a contacting portion of the conveyance robot in contact with the lifting fork portion.

Further, since a base unit of the conveyance robot is normally fixed to a base placed at a predetermined position or the base placed at a slide rail, it is necessary to release the fixed state when the conveyance robot is carried in/out. Here, in the conventional conveyance robot replacement method using the hand lifter, the lifting fork portion does not support the conveyance robot and further, a fixed state of the conveyance robot to the base is released, which results in a period of time during which the conveyance robot becomes unstable. The manipulation of the hand lifter is performed through the visual observation or experience of a worker. Thus, when the lifting fork portion collides with the conveyance robot during the replacement work, the conveyance robot may be fallen down to be impaired and the worker may be exposed to danger by the fallen conveyance robot.

An object of the present disclosure intends to provide a conveyance robot replacement apparatus and a conveyance robot replacement method enabling the conveyance robot to be replaced safely and securely without impairing the conveyance robot.

In order to achieve the object described above, a conveyance robot replacement apparatus of one aspect of the present disclosure is used for replacing a conveyance robot installed in an atmospheric conveyance chamber of a semiconductor manufacturing apparatus in order to convey a substrate. The conveyance robot replacement apparatus includes a positioning unit configured to perform positioning of the conveyance robot replacement apparatus with respect to the atmospheric conveyance chamber, a holding unit configured to suspend and support the conveyance robot, a guide portion configured to guide a back and forth movement with respect to the atmospheric conveyance chamber of the holding unit by being engaged with the positioning unit, a position adjustment unit configured to move the holding unit in each of longitudinal, horizontal, and vertical directions to adjust a position of the holding unit, and a connecting component configured to be connectable to the holding unit as well as to the conveyance robot. In the conveyance robot replacement apparatus, the connecting component attached to the conveyance robot is connected with a tip end of the holding unit such that the holding unit suspends and supports the conveyance robot.

In order to achieve the object described above, a conveyance robot replacement method of another aspect of the present disclosure is used for replacing a conveyance robot installed in an atmospheric conveyance chamber of a semiconductor manufacturing apparatus in order to convey a substrate using a conveyance robot replacement apparatus. The conveyance robot replacement method includes temporarily fixing a connecting component to a predetermined position of the conveyance robot, positioning a holding unit that suspends and supports the conveyance robot in the conveyance robot replacement apparatus, fixing a direction of moving back and forth the holding unit with respect to the atmospheric conveyance chamber, temporarily fixing the connecting component temporarily fixed to the conveyance robot and the tip end of the holding unit by putting the tip end of the holding unit into the atmospheric conveyance chamber to access the connecting component, releasing fixation of the conveyance robot within the atmospheric conveyance chamber, actually fixing the conveyance robot and the connecting component with each other and actually fixing the connecting component and the holding unit with each other, and drawing out the holding unit that suspends and supports the conveyance robot from the inside of the atmospheric conveyance chamber.

In order to achieve the object described above, a conveyance robot replacement method of yet another aspect of the present disclosure is used for replacing a conveyance robot installed in an atmospheric conveyance chamber of a semiconductor manufacturing apparatus in order to convey a substrate using a conveyance robot replacement apparatus. The conveyance robot replacement method includes positioning a holding unit in a state where the holding unit suspends and supports the conveyance robot through a connecting component in the conveyance robot replacement apparatus, fixing a direction of moving back and forth the holding unit with respect to the atmospheric conveyance chamber, allowing the holding unit suspending the conveyance robot to be supported to advance into the atmospheric conveyance chamber so as to align a position of the conveyance robot with the predetermined position within the atmospheric conveyance chamber, adjusting a connection between the conveyance robot and the connecting component to a temporarily fixed state and adjusting a connection between the conveyance robot and the connecting component to a temporarily fixed state, fixing the conveyance robot to a predetermined position within the atmospheric conveyance chamber, detaching the connecting component from the conveyance robot and the holding unit, and retreating the holding unit from the inside of the atmospheric conveyance chamber.

According to the present disclosure, the position of the holding unit that suspends and supports the conveyance robot may be easily adjusted with respect to a robot installed in the atmospheric conveyance chamber and the conveyance robot is suspended and supported on the holding unit through a connecting component. Accordingly, since the conveyance robot is able to be conveyed in a stable state without being scratched, the conveyance robot is replaced safely and securely. Further, according to the present disclosure, since a single worker is able to operate (handle) the conveyance robot replacement apparatus, an accident, which is caused by a linkage mistake that easily occurs in a conventional operation requiring a plurality of workers, does not occur and working hours may be reduced.

Hereinafter, descriptions will be made on exemplary embodiments of the present disclosure with reference to accompanying drawings. Here, it is assumed that a conveyance robot, as a conveyance robot which is an operation target by the conveyance robot replacement apparatus according to the present disclosure, installed in a loader module of a semiconductor manufacturing apparatus is taken up. Accordingly, first, descriptions will be made on a schematic configuration of the semiconductor manufacturing apparatus.

FIG. 1 is a perspective view illustrating a schematic configuration of a semiconductor manufacturing apparatus 10 and FIG. 2A is a plan view illustrating a schematic configuration of the semiconductor manufacturing apparatus 10. As illustrated in FIG. 1 and FIG. 2A, it is assumed that a three-dimensional XYZ orthogonal coordinate system is established for the semiconductor manufacturing apparatus 10. The X-direction corresponds to a horizontal direction and a length direction of the semiconductor manufacturing apparatus 10, the Y-direction corresponds to a horizontal direction and a width direction of the semiconductor manufacturing apparatus 10, and the Z-direction is a vertical direction.

The semiconductor manufacturing apparatus 10 handles a semiconductor wafer (hereinafter, referred to as a "wafer") W which is a substrate having a diameter of, for example, 300 mm, as a processing target object and performs a predetermined processing on the wafer W. The predetermined processing may include, for example, but is not limited to, various plasma processings, for example, such as a plasma etching processing, a plasma ashing processing, and a plasma CVD film forming processing, a coating processing and a developing processing of, e.g., a resist film, a cleaning processing to remove, e.g., foreign material attached to the wafer W, a heat treatment for film-forming, and a wet etching processing.

The semiconductor manufacturing apparatus 10 includes a wafer processing module 11 that performs a predetermined processing on the wafer W, a loader module 13 placed to be opposed to the wafer processing module 11 at a predetermined interval in the X-direction, a wafer relay module 12 placed between the wafer processing module 11 and the loader module 13, and load ports 14a, 14b, and 14c placed at an opposite side of the wafer relay module 12 in the X-direction with the loader module 13 being interposed therebetween.

In the wafer processing module 11, a plurality of process modules (not illustrated) performing a predetermined processing on the wafer W and, a wafer conveyance robot (not illustrated) conveying the wafer W between the plurality of process modules and the wafer relay module 12 are placed. In the meantime, when the wafer processing module 11 is intended to perform a processing on the wafer W in a vacuum atmosphere, the inside of the wafer processing module 11 is wholly maintained at a predetermined vacuum level, and the wafer relay module 12 is configured to be switchable between a vacuum atmosphere and an atmospheric atmosphere.

The wafer relay module 12 includes a wafer placement table (placement table) for temporarily maintaining a wafer W conveyed from the loader module 13 to the wafer processing module 11 or a wafer W returned from the wafer processing module 11 to the loader module 13. The wafer conveyance robot installed in the wafer processing module 11 and a wafer conveyance robot 20 (hereinafter, described as a "conveyance robot 20") installed in the loader module 13 are adapted to be accessible to the wafer placement table installed in the wafer relay module 12. The wafer conveyance robot 20 will be described later.

The loader module 13 is configured as an atmospheric conveyance chamber in a rectangular parallelepiped shape. Inside the loader module 13, the conveyance robot 20 conveying a wafer W between the wafer relay module 12 and containers 30 placed in the load ports 14a, 14b, and 14c is installed as illustrated in FIGS. 2A and 2B. Here, it is assumed that a fixed type robot equipped with a multi-articulated conveyance arm is used as the conveyance robot 20.

A container 30 (e.g., FOUP) accommodating a plurality of wafers W (e.g., 25 sheets) is placed in each of three load ports 14a, 14b, and 14c. Since loading and unloading of wafers W with respect the container 30 by the conveyance robot 20 are not directly related to the present disclosure, descriptions thereof will be omitted. The semiconductor manufacturing apparatus 10 includes a control apparatus 15 implemented with a computer and controls the entire operation of the semiconductor manufacturing apparatus 10.

Next, descriptions will be made on a configuration and function of a conveyance robot replacement apparatus (hereinafter, referred to as a "replacement apparatus") used for replacing the conveyance robot 20, and a replacement method of the conveyance robot 20 by the replacement apparatus.

In the semiconductor manufacturing apparatus 10, in order to replace the conveyance robot 20, the load port 14b may be selectively detached from the loader module 13 and, among front panels 13a, 13b, and 13c (see FIG. 1) of a housing (case) that form the outer appearance of the loader module 13, a front panel 13b may be detached. FIG. 2B is a plan view illustrating a state where the load port 14b and the front panel 13b are removed. An opening portion formed due to the removal of the front panel 13b is used as a carry-in/out port for carrying in/out the conveyance robot 20.

Figure 3:
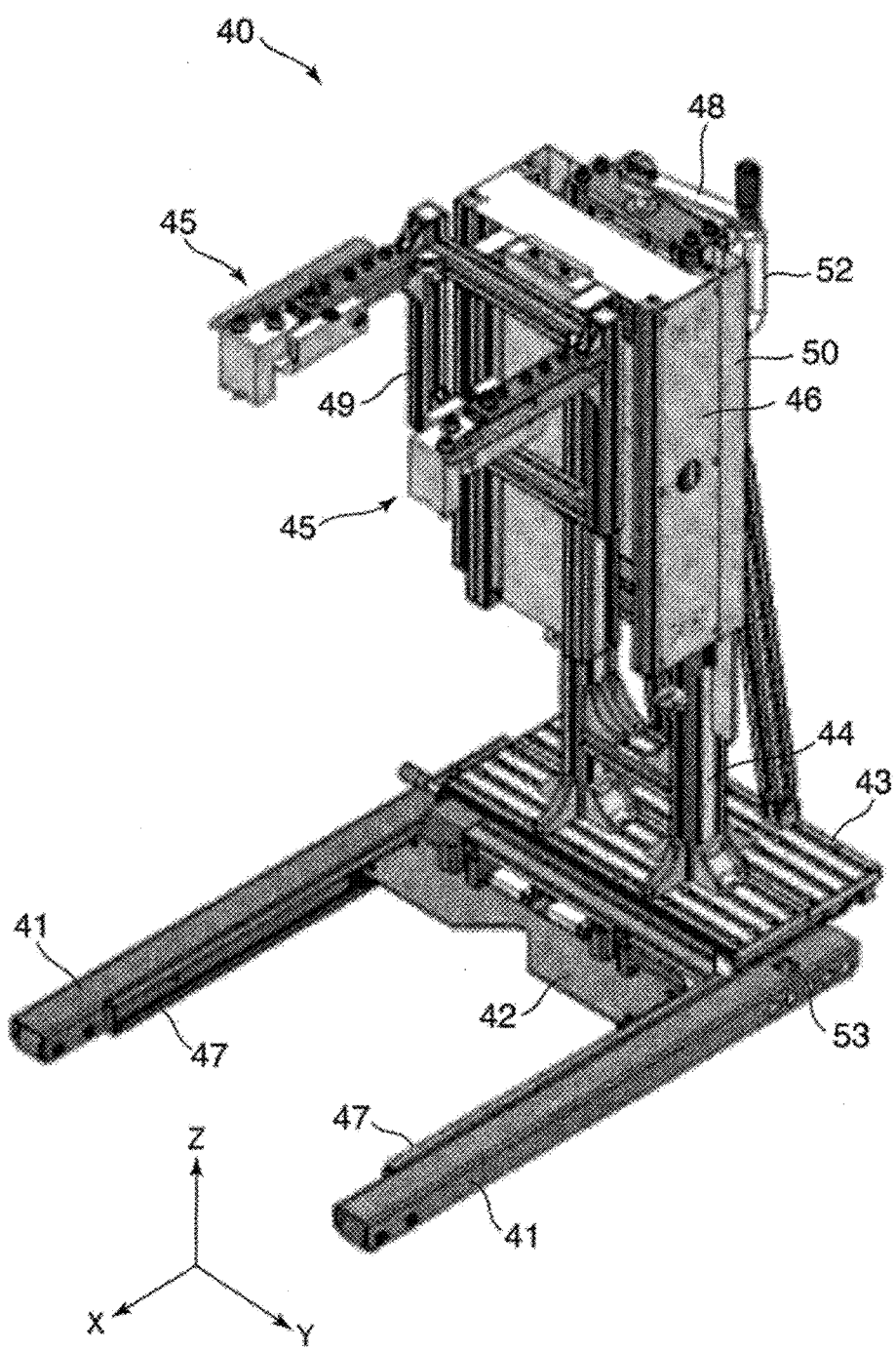
FIG. 3 is a perspective view illustrating a schematic structure of a replacement apparatus for carrying in/out a conveyance robot with respect to a loader module of the semiconductor manufacturing apparatus of FIG. 1.

FIG. 3 is a perspective view illustrating a schematic structure of a replacement apparatus 40. It is assumed that three dimensional XYZ orthogonal coordinate system is established for the replacement apparatus 40 as illustrated in FIG. 3. Each of the X-direction (longitudinal direction), Y-direction (width direction (lateral direction)), and the Z-direction (height direction) prescribed for the replacement apparatus 40 coincides with each of the X-direction, Y-direction, and Z-direction prescribed for the semiconductor manufacturing apparatus 10 in FIG. 1 at the time when the replacement apparatus 40 is accessed to the semiconductor manufacturing apparatus 10.

In consideration of, for example, a shape of a carry-in/out port (see FIG. 2B) formed in front of the loader module 13 and a frame structure constituting the loader module 13, the replacement apparatus 40 is configured to be suitable for the shape of the carry-in/out port and the frame structure, and generally includes horizontal leg units 41, a positioning unit 42, a base plate 43, vertical leg units 44, holding arms 45, an arm position adjustment unit 46, and a rear panel 50.

At a bottom surface side (lower side in the Z-direction) of each of two horizontal leg units 41, a roller is placed so as to move the replacement apparatus 40 in the X-direction which corresponds to the length direction of the horizontal leg units 41. When a worker firmly grasp a grip 52 installed in the rear panel 50 and presses/pulls the rear panel 50 towards a front side (holding arm 45 side)/rear side (grip 52 side), the entire replacement apparatus 40 may be moved in the X-direction.

Guide rails 47 are provided on the opposite inner surfaces of the two horizontal leg units 41, respectively, and the positioning unit 42 is placed to be linearly slidable along the X-direction which corresponds to the length direction of the guide rails 47. In the meantime, a lock mechanism 53 configured to lock the positioning unit 42 at a position of a tip end located at the front side of the guide rails 47 is installed in each of two horizontal leg units 41. The detailed configuration and using method of the positioning unit 42 and details of the lock mechanism 53 will be described below.

The base plate 43 is a member responsible for connecting the two horizontal leg units 41 with each other substantially in parallel and acting as a base to support the vertical leg unit 44. In the meantime, a roller 85 (see FIG. 9A) configured to move the replacement apparatus 40 is also installed in the base plate 43.

The vertical leg units 44 fixed on the top surface of the base plate 43 support the rear panel 50 used for maintaining the arm position adjustment unit 46. The rear panel 50 is provide with a first rotary handle 48 to adjust the position of the arm position adjustment unit 46 in the height direction (position in the Z-direction) with respect to the rear panel 50. When the first rotary handle 48 may be rotated in a predetermined direction, the position of the arm position adjustment unit 46 in the Z-direction is finely adjusted. In the meantime, the arm position adjustment unit 46 maintains a frame 49 to which two holding arms 45 are attached and thus, when the position of the arm position adjustment unit 46 is adjusted in the Z-direction, the position of the holding arm 45 is adjusted in the Z-direction.

The arm position adjustment unit 46 is provided with a second rotary handle 51 (not illustrated in FIG. 3, see FIG. 7A and FIG. 7B) to adjust the positions of the two holding arms 45 in the width direction (position in the Y-direction). When the second rotary handle 51 is rotated in a predetermined direction, the position of the frame 49 that supports the two holding arms 45 in the Y-direction is finely adjusted. Accordingly, the positions of the two holding arms 45 in the Y-direction may be adjusted.

Figure 4A:
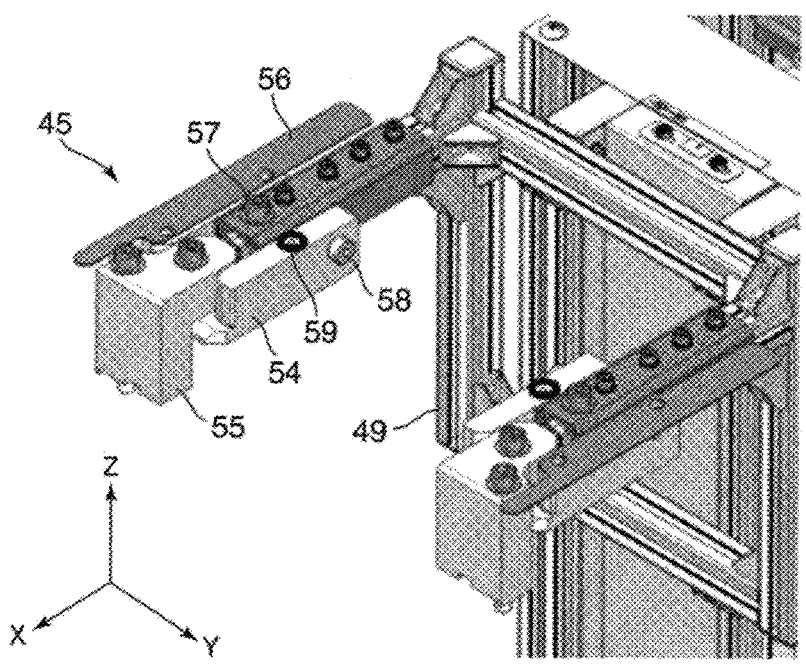
FIGS. 4A to 4C are perspective views illustrating a schematic structure of a holding arm provided in the replacement apparatus of FIG. 3 and constitutional components of the holding arm.
Figure 4B:
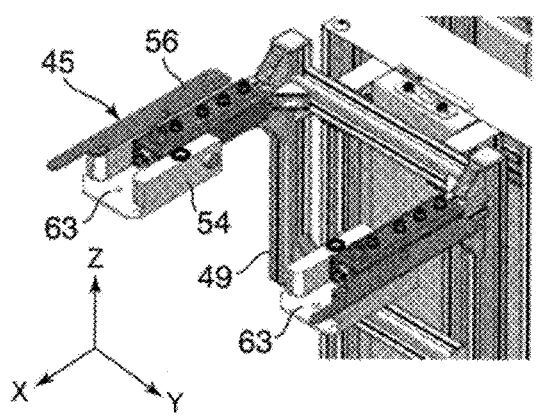

FIG. 4A is a perspective view illustrating a structure of the holding arms 45 and FIG. 4B illustrates a state before the replacement apparatus 40 is used. The two holding arms 45 are members responsible for directly suspending and supporting (holding) the conveyance robot 20 in the replacement apparatus 40. The two holding arms 45 have a symmetrical structure with respect to the ZX plane.

A tip end component 54 is attached to a tip end of a main body of each holding arm 45. The tip end component 54 is rotatable around a bolt 58 to be attached to the main body of the holding arm 45 by the bolt 58 placed in parallel with the Y-direction. Further, a horizontal adjustment bolt 57 provided in the main body of the holding arm 45 is inserted into a through hole (not illustrated) formed in the main body of the holding arm 45 and screwed in a bolt hole (not illustrated) formed in the tip end component 54. Accordingly, the position of the tip end of the tip end component 54 is adapted to be turned in the Z-direction (that is, to be maintained in a state where the tip end component is inclined by a predetermined angle from a horizontal position) according to the tightened condition of the horizontal adjustment bolt 57. In the meantime, since the tip end component 54 is normally maintained in a horizontal state, a level 59 is installed on the top surface of the tip end component 54.

Figure 4C:
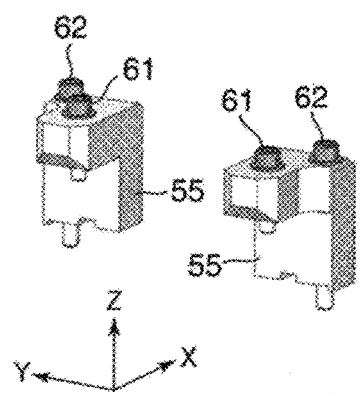

A connecting component 55 is detachably attached to each tip end component 54. FIG. 4B is a perspective view illustrating a structure of the holding arms 45 in which the connecting components 55 are removed therefrom and FIG. 4C is a perspective view illustrating a structure of the connecting components 55.

When an operation of inserting the holding arms 45 into the loader module 13 is performed in order to carry the conveyance robot 20 out of the loader module 13, the connecting components 55 are detached from the tip end components 54 in advance and attached to predetermined positions on the conveyance robot 20. Although details of the connecting components 55 will be described in conjunction with the using method of the replacement apparatus 40, the connecting components 55 are attached to the tip end components 54 by inserting the first bolts 61 into the through holes formed in the connecting components 55 and screwing the first bolt 61 in bolt holes 63 formed in the tip end components 54. Further, the connecting components 55 are attached to the conveyance robot 20 by inserting the second bolts 62 into separate through holes formed in the connecting components 55 and the second bolts 62 are screwed in bolt holes 96 (see FIG. 6B) formed in the conveyance robot 20. That is, the connecting components 55 are responsible for suspending and supporting the conveyance robot 20 using the second bolts 62 in a state where the connecting components are fixed to the tip end component 54 by the first bolts 61.

In the meantime, depending on an installation form of the conveyance robot 20, it is expected that the surfaces in contact with the tip end components 54 in the connecting components 55 attached to the conveyance robot 20 may be inclined from the horizontal position by a predetermined angle. In this case, each tip end component 54 has a rotatable structure as described above such that the surfaces in contact with the tip end components 54 in the connecting components 55 and the surfaces in contact with the connecting components 55 in the tip end components 54 are positioned in parallel with each other.

Guard members 56 are respectively attached to and arranged on the tip end components 54 outside two holding arms 45 in the Y-direction. As illustrated in FIG. 10 to be described below, when the replacement apparatus 40 is viewed in the Z-direction in a case where the replacement apparatus 40 is in a state where the conveyance robot 20 is suspended and supported, the width from the outside of one guard member 56 in the Y-direction to the outside of the other guard member 56 in the Y-direction is set such that the width of the conveyance robot 20 in the Y-direction is fitted in the range of the width of the guard members 56 in the Y-direction. With this configuration, when the holding arms 45 are inserted and removed into and from the carry-in/out port formed in the front of the loader module 13 so that the guard members 56 do not collide with side surfaces (wall surfaces) of the carry-in/out port sides of the front panels 13a and 13c, the conveyance robot 20 suspended and supported on the holding arms 45 may be prevented from colliding with the front panels 13a and 13c.

Other configurations of the replacement apparatus 40 will be properly described in conjunction with the using method of the replacement apparatus 40 which will be described below.

Next, descriptions will be made on the using method of the replacement apparatus 40. Here, it is assumed that the conveyance robot 20 is carried out of the loader module 13, by way of an example.

Figure 5:
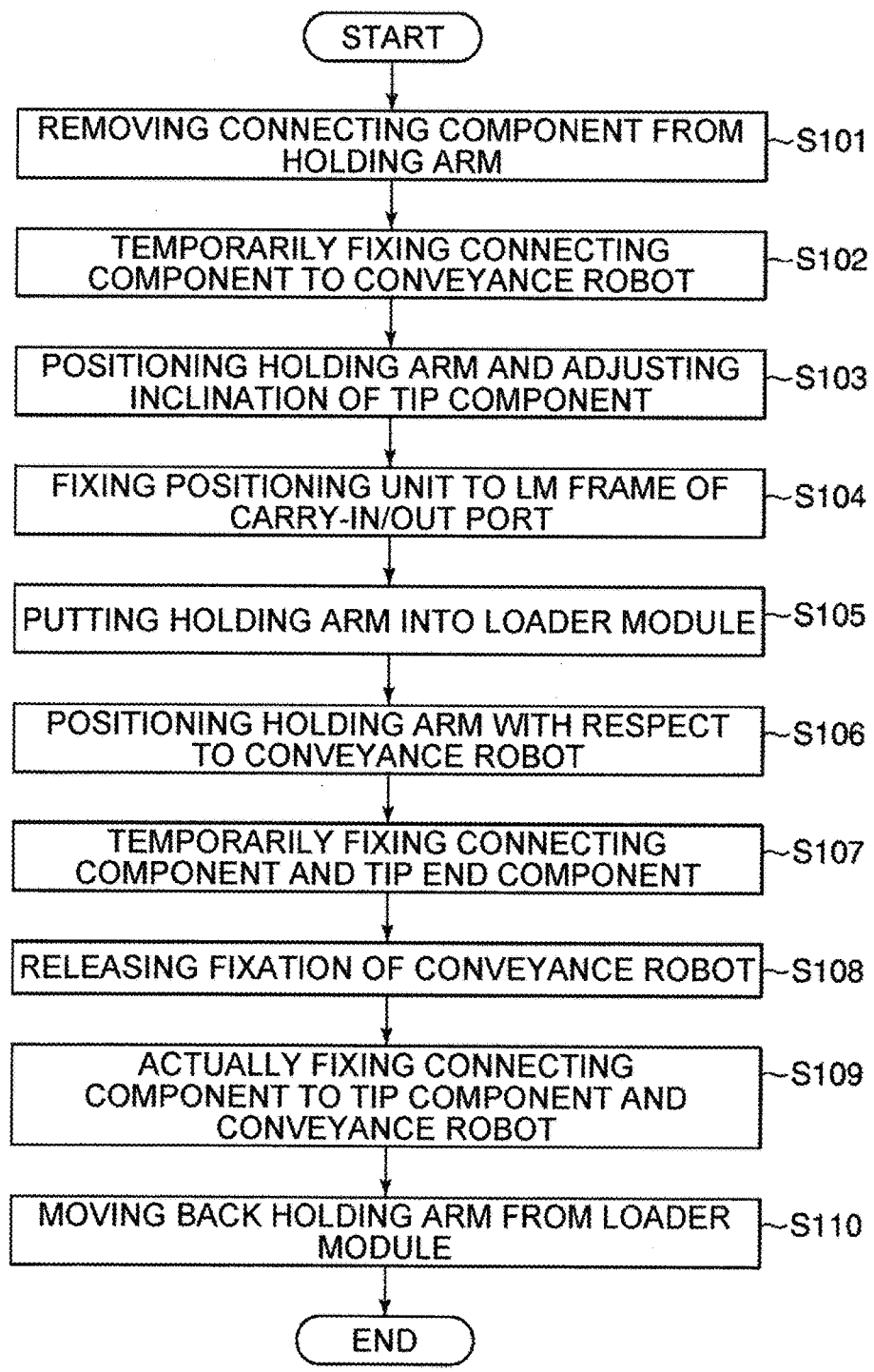
FIG. 5 is a flowchart illustrating an operational sequence of a process of carrying out a conveyance robot from a loader module of the semiconductor manufacturing apparatus of FIG. 1 using the replacement apparatus of FIG. 3.

FIG. 5 is a flowchart illustrating an operational sequence of carrying the conveyance robot 20 out of the loader module 13 using the replacement apparatus 40. In the following description, it is assumed that the conveyance robot 20 is carried out through the carry-in/out port formed in front surface of the loader module 13 as illustrated in FIG. 2B. The carry-in/out port has an enough width in the Y-direction for moving back and force the holding arms 45 of the replacement apparatus 40 therethrough in the X-direction and further, carrying-in/out the conveyance robot 20 suspended and supported on the holding arm 45.

At step S101, regarding the replacement apparatus 40, the connecting components 55 are detached from the holding arms 45 (tip end components 54) in the state illustrated in FIG. 4A so that the replacement apparatus 40 is in the state illustrated in FIG. 4B.

At subsequent step S102, the connecting components 55 detached at step S101 are temporarily fixed to the conveyance robot 20. FIG. 6A is a view for explaining a method of attaching the connecting components 55 to the conveyance robot 20 and FIG. 6B is an enlarged view of the region "A." The conveyance robot 20 includes a base 20a, an arm portion 20b placed on the base 20a. In the region "A" illustrated in FIG. 6A, a bolt hole 95 is formed on the top surface of the base 20a as illustrated in the enlarged diagram of FIG. 6B. In the meantime, another bolt hole 95 is also formed at the right side in the drawing with the arm portion 20b being interposed between the bolt holes 95.

Since set screws (not illustrated) for protecting from dust or the like are attached to the bolt holes 95, the connecting components 55 are temporarily fixed by the second bolts 62 after removing the set screws. In the meantime, the connecting components 55 are temporarily fixed to be shaken to some extent upon being contacted. FIG. 6C illustrates a state where the connecting components 55 are temporarily fixed to the base 20a, but illustration of the second bolts 62 is omitted. Here, it is assumed that the top surface of the base 20a of the conveyance robot 20 is horizontally arranged and a surface that is in contact with the tip end components 54 in the connecting components 55 temporarily fixed to the top surface of the base 20a is horizontally arranged.

At step S103, the positioning of the holding arms 45 in the replacement apparatus 40 (position in the Z-direction and the position in the Y-direction) and adjustment of the inclination of the tip end components 54 are performed. In the meantime, step S103 may be performed prior to steps S101 and S102.

Figures 7A, 7B:
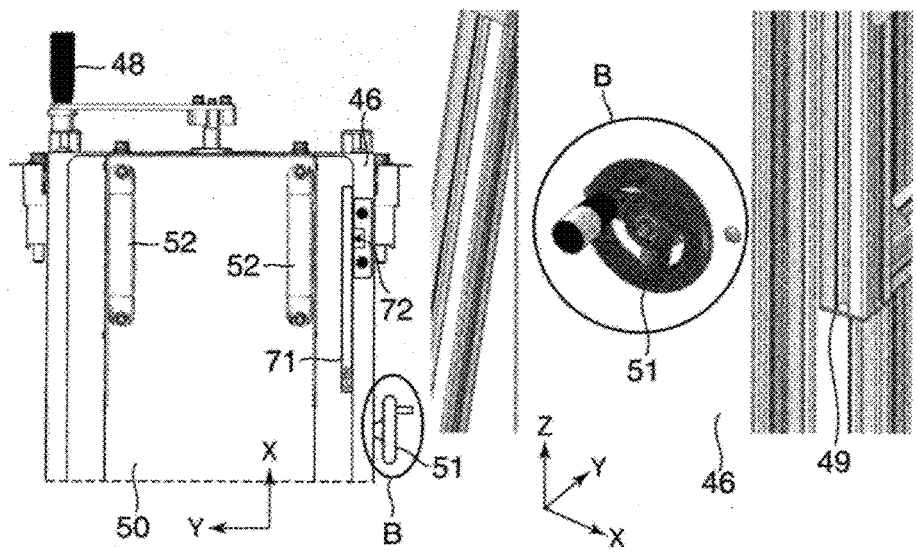
FIGS. 7A to 7D are views for explaining a position alignment mechanism of a holding arm used at step S103 of FIG. 5.

FIGS. 7A to 7D are views for explaining a position alignment mechanism of the holding arms 45 installed in the replacement apparatus 40. FIG. 7A illustrates a position alignment mechanism for aligning the positions of the holding arms 45 in the Z-direction. As the first rotary handle 48 rotates, the arm position adjustment unit 46 moves in the Z-direction with respect to the rear panel 50 such that a value indicated by a marker 72 provided in the arm position adjustment unit 46 is changed with respect to a scale 71 (illustration of gradations is omitted) provided in the rear panel 50. Accordingly, the first rotary handle 48 is rotated such that the marker 72 indicates a predetermined value. In the meantime, the predetermined value indicated by the marker 72 is determined according to a position at which the holding arms 45 (replacement apparatus 40) are accessed to the structure of the carry-in/out port and the loader module 13. Therefore, it is possible to suppress the necessity to adjust the positions of the holding arms 45 to the minimum in a later work.

Figures 7C, 7D:
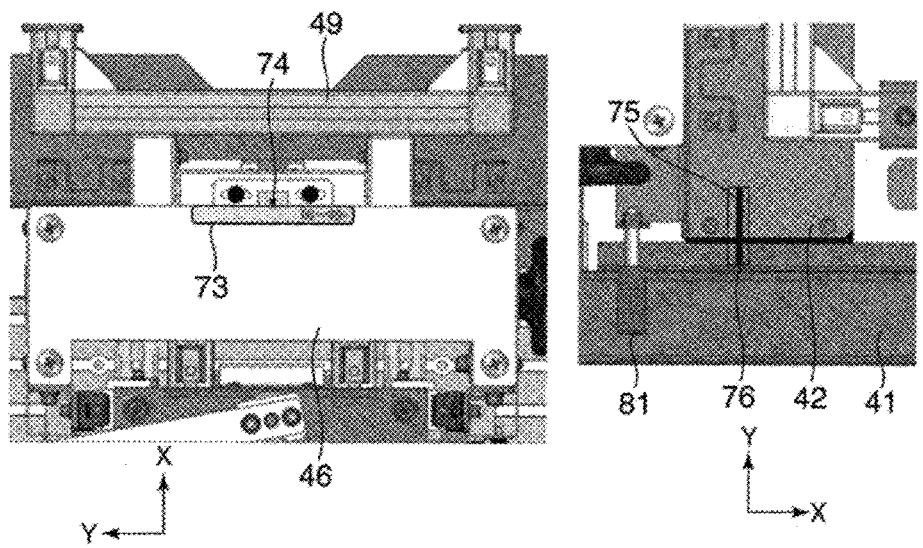

FIG. 7B is an enlarged perspective view of the region "B" illustrated in FIG. 7A. Further, FIG. 7C is a view illustrating a position alignment mechanism for the positions of the holding arms 45 in the Y-direction. A second rotary handle 51 for adjusting the positions of the two holding arms 45 in the Y-direction are installed in the arm position adjustment unit 46. When the second rotary handle 51 is rotated, the frame 49 moves along the Y-direction with respect to the arm position adjustment unit 46 such that a value indicated by the marker 74 provided in the frame 49 is changed with respect to a scale 73 (illustration of gradations is omitted) provided in the arm position adjustment unit 46. Accordingly, the second rotary handle 51 is rotated such that the marker 74 indicates a predetermined value. In the meantime, the predetermined value indicated by the marker 74 is also determined according to a position at which the replacement apparatus 40 is accessed the structure of the carry-in/out port and the loader module 13. Therefore, it is possible to suppress necessity to adjust the positions of the holding arms 45 to the minimum in a later work. Further, the markers 72 and 74 are used such that a worker may always handle the replacement apparatus 40 in the same condition without relying on an experience of the worker.

As will be described below, in the present exemplary embodiment, the positioning unit 42 is fixed to a frame of the loader module of the carry-in/out port (hereinafter, referred to as "LM frame") in order to allow the holding arms 45 to smoothly enter the loader module 13. Therefore, it is confirmed whether it is possible to accurately determine the position of the positioning unit 42 with respect to the horizontal leg unit 41 in order to normally fix the positioning unit 42 and confirm that mechanical distortion has not occurred.

FIG. 7D is a view illustrating a position alignment mechanism of the positioning unit 42 with respect to the horizontal leg unit 41. A marker 75 is printed (or engraved) on the top surface of the positioning unit 42 and a marker 76 is printed (or engraved) on the top surface of the horizontal leg units 41. The worker of the replacement apparatus 40 is able to slide the positioning unit 42 in the length direction of the guide rails 47, by firmly grasping the lever 81 to smoothly move the positioning unit 42, and further confirms whether the markers 75 and 76 may be coincident with each other.

Adjusting the inclination of the tip end components 54 intends to allow the tip end components 54 and the connecting components 55 to be temporarily fixed by the first bolts 61. As described above, the surfaces of the connecting components 55 which are in contact with the tip end components 54 are horizontal. Therefore, since levelness between the tip end components 54 and the connecting components 55 is maintained when the tip end components 54 and the connecting components 55 are temporarily fixed by the first bolts 61, the through holes formed in the connecting components 55 and the bolt holes 63 formed in the tip end components 54 are arranged linearly. Thus, it becomes easy to temporarily fix the components. Since the adjustment of the inclination of tip end components 54 has been described above with reference to FIG. 4, descriptions thereof will be omitted.

Figure 8A:
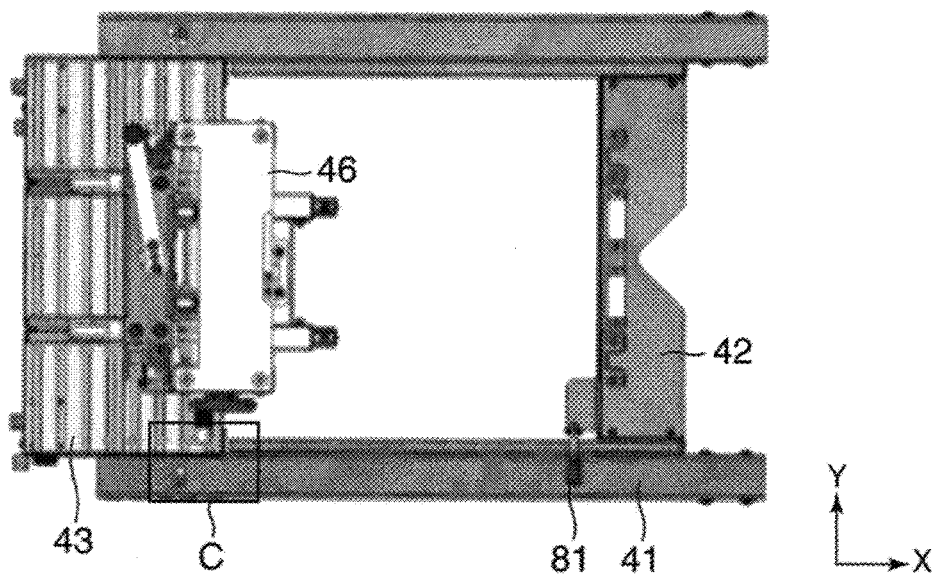
FIGS. 8A and 8B are a whole view and a partially enlarged view of the replacement apparatus for explaining placement of a positioning unit at step S104 of FIG. 5.
Figure 8B:
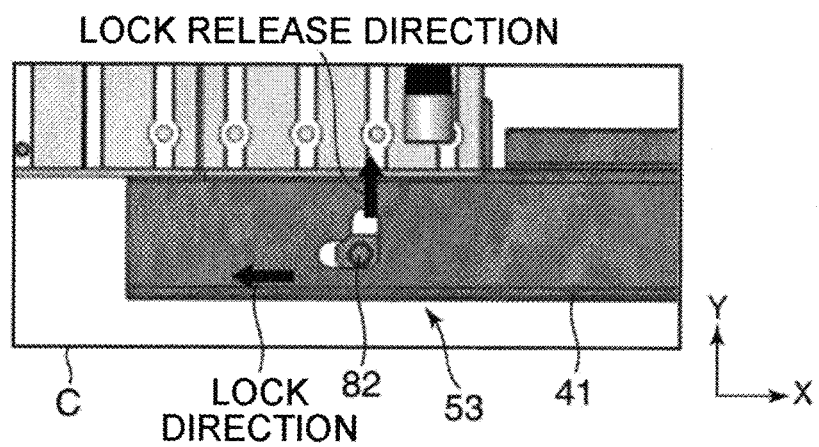

At subsequent step S104, the positioning unit 42 is fixed to the LM frame of the carry-in/out port. FIGS. 8A and 8B are views for explaining a placement of the positioning unit 42 at step S104 and correspond to plan views illustrating a state of the replacement apparatus 40 before the positioning unit 42 is fixed to the LM frame of the carry-in/out port. FIG. 8A illustrates a whole view of the replacement apparatus 40, and FIG. 8B illustrates an enlarged view of the region "C". In FIGS. 8A and 8B, illustration of the holding arms 45 is omitted in order to illustrate the entirety of the positioning unit 42.

Figure 9A:
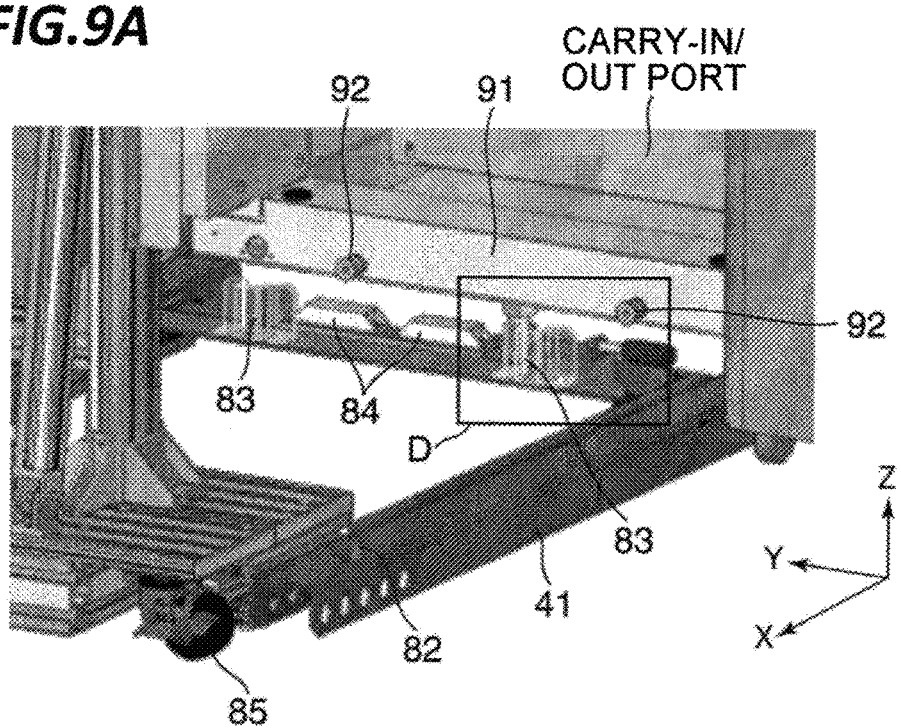
FIGS. 9A and 9B are perspective views illustrating a situation where the replacement apparatus is accessed to a carry-in/out port in a state where the positioning unit is fixed to a tip end of a guide rail at step S104 of FIG. 5.

The worker firmly grasps the lever 81 installed in the positioning unit 42 and moves the positioning unit 42 to the position of the tip end of the guide rail 47 so that the positioning unit 42 is in the state illustrated in FIG. 8A. The positioning unit 42 may be moved in a state where a lock pin 82 protruding from an L-shaped opening formed in each horizontal leg unit 41 is moved in a lock release direction illustrated in FIG. 8B. In the meantime, FIG. 9A illustrates the lock pin 82 in the state of protruding from the L-shaped opening. The worker may manually manipulate the lock pin 82 to change the position of the lock pin 82.

The lock pin 82 is moved in a lock direction illustrated in FIG. 8B after the positioning unit 42 is moved to the position of the tip end of the guide rail 47. Accordingly, a pin (not illustrated) formed in the horizontal leg unit 41 may protrude towards the positioning unit 42 so as to fix the position of the positioning unit 42 in the X-direction with respect to the horizontal leg unit 41.

Figure 9B:
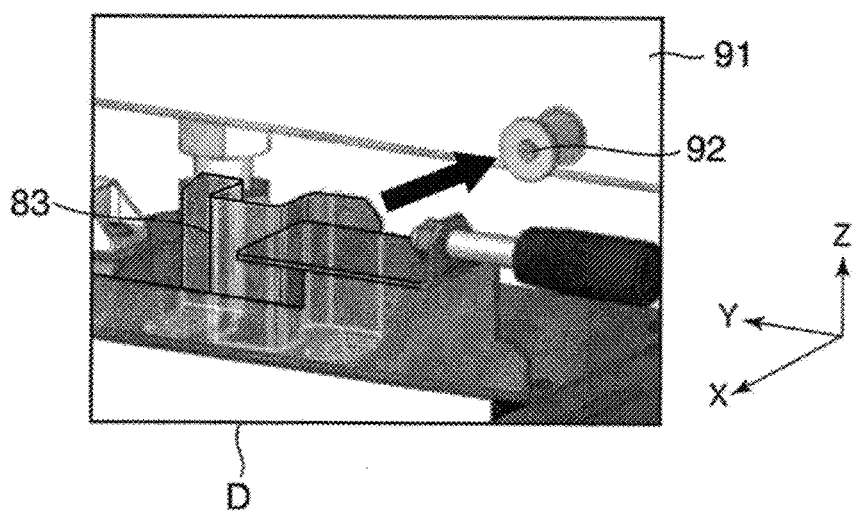

FIGS. 9A and 9B are perspective views illustrating a state where the replacement apparatus 40 is accessed to the carry-in/out port in a state where the positioning unit 42 is fixed to the tip end of the guide rail 47. FIG. 9A is a whole view and FIG. 9B is an enlarged view of the region "D".

The LM frame 91 below the carry-in/out port includes projection portions 92 formed at two sites. In the meantime, the positioning unit 42 includes engagement fixtures 83 provided at two sites to correspond to the projection portions 92 formed at the two sites. The X-direction of the semiconductor manufacturing apparatus 10 and the X-direction of the replacement apparatus 40 are approximately aligned and the tip ends of the horizontal leg units 41 are accessed to the carry-in/out port such that the projection portions 92 are accommodated in recesses of the engagement fixtures 83.

The LM frame 91 is made of a metal such as iron which is a magnetic material. In the meantime, magnets 84 are provided on the positioning unit 42. When the projection portions 92 are accommodated in the engagement fixture 83s, the magnets 84 are closely attached and adhered to the bottom surface of the LM frame 91 by a magnetic force and accordingly, the positioning unit 42 is fixed to the LM frame 91.

At the next step S105, the holding arms 45 are put into the loader module 13. In this case, since the positioning unit 42 is fixed to the LM frame 91 and the positioning unit 42 is also fixed with respect to the guide rails 47 by the operation at the preceding step S104, first, the lock pin 82 is moved to the lock release direction (see FIG. 8B) so that the locked state of the positioning unit 42 with respect to the guide rails 47 is released. Accordingly, the guide rails 47 (horizontal leg units 41) become slidable with respect to the positioning unit 42.

Next, when the worker firmly grasps the grip 52 and pushes the replacement apparatus 40 towards the loader module 13 side, the holding arms 45 may be put into the loader module 13 in such a way that the positioning unit 42 fixed to the LM frame 91 guides the guide rails 47. In this case, since the positions of the holding arms 45 with respect to the conveyance robot 20 are determined at step S103, the holding arms 45 normally do not collide with the conveyance robot 20. However, the worker may make the holding arms 45 enter into the loader module 13 while confirming the moving path of the holding arms 45. When the positioning unit 42 is positioned at the other side (rear panel 50 side) of the guide rails 47, the replacement apparatus 40 is unable to be pushed toward the loader module 13 side and thus, the operation at step S105 is terminated.

At the next step S106, the positioning of the holding arms 45 with respect to the conveyance robot 20, that is, the positions of the tip end components 54 and the connecting components 55 are aligned with each other. Specifically, the first rotary handle 48 and the second rotary handle 51 are manipulated as needed so as to finely adjust the position of the holding arms 45 and further, the position of the replacement apparatus 40 in the X-direction is adjusted as needed so that the positions of the tip end component 54 are aligned with the positions where the tip end components 54 and the connecting components 55 are able to be temporarily fixed by the first bolts 61. In the meantime, the operation at step S106 is performed in a case where the operation at the next step S105 is not able to be performed when the condition after the operation at step S107 remains. Thus, the operation at step S106 may be omitted depending on an accuracy of positioning at step S103. After the operation at step S107 is terminated, the roller 85 installed on the base plate 43 (see FIG. 9A) may be locked.

At the next step S107, the connecting components 55 temporarily fixed to the conveyance robot 20 are temporarily fixed to the tip end components 54 attached to the holding arms 45 by the first bolts 61. As apparent from steps S105, S106, and S107, in the replacement work of the conveyance robot 20 by the replacement apparatus 40 in the present exemplary embodiment, the holding arms 45 and the tip end components 54 entering into the loader module 13 do not come in direct contact with the conveyance robot 20. Thus, a problem that the conveyance robot 20 is scratched does not occur.

Figure 10A:
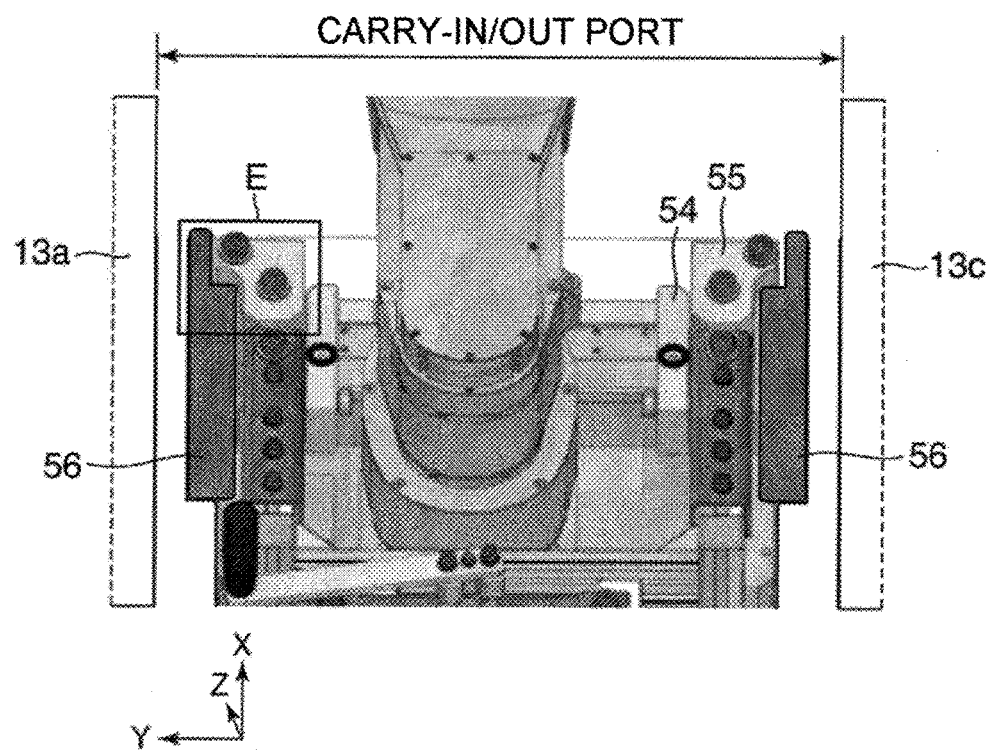
FIGS. 10A and 10B are views illustrating a situation where the first component is actually fixed to a second component and the conveyance robot by the operation performed at step S109 of FIG. 5.
Figure 10B:
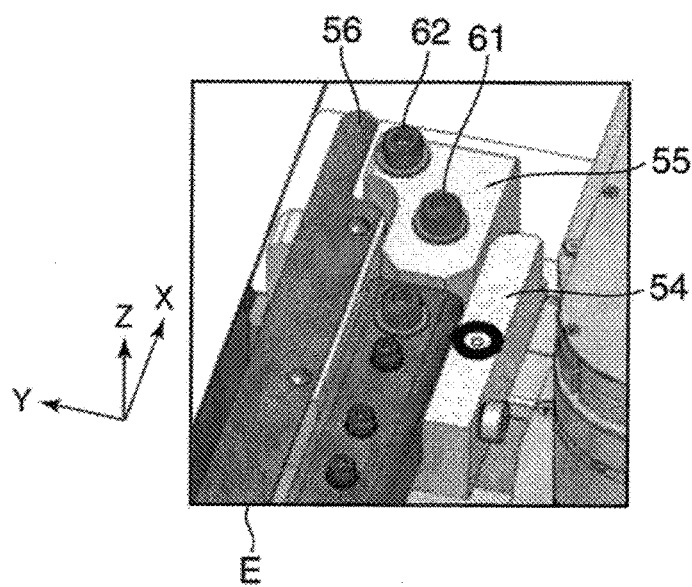

At the next step S108, the fixation of the conveyance robot 20 is released. In the meantime, the method of releasing the fixation of the conveyance robot 20 is performed depending on an installation situation of the conveyance robot 20 and is not directly related to carrying-in/out of the conveyance robot 20. Thus, descriptions thereof will be omitted. Thereafter, at step S109, an actual fixation to firmly fix the connecting components 55 and the conveyance robot 20 by the second bolts 62 is performed while an actual fixation to firmly fix the tip end components 54 and the connecting component s55 by the first bolts 61 is performed. FIGS. 10A and 10B are views illustrating a situation where the tip end components 54 and the connecting components 55 are actually fixed by the first bolts 61 and also the connecting components 55 and the conveyance robot 20 are actually fixed by the second bolts 62. In the meantime, FIG. 10A is a whole view and FIG. 10B is an enlarged view of the region "E" in FIG. 10A.

The reason why the operations are performed in the sequence of steps S107 step S108, and step S109 is as follows. That is, at the time of performing the temporal fixation at step S107, the conveyance robot 20 is fixed to, for example, a fixing table or fixing plate (not illustrated) installed in the loader module 13 while the conveyance robot 20 is not in an unmovable state. In this state, when the connecting components 55 and the conveyance robot 20 are actually fixed while the tip end components 54 and the connecting components 55 are actually fixed, a problem such as, for example, deformation of the tip end components 54 or the holding arms 45 may occur as a large load (stress) acts on the tip end components 54. Further, there is a concern that the operation of releasing the conveyance robot 20 from the fixing table or fixing plate may not be easily performed. For example, in a case where the conveyance robot 20 and the fixing table are fastened by a plurality of bolts, the stress applied to the holding arms 45 due to the fixation of the conveyance robot 20 may make the unscrewing rotation of the bolts uneasy during the late part of the releasing operation. However, in a state where the connecting components 55 are temporarily fixed to each of the tip end components 54 and the conveyance robot 20, the stress from the holding arms 45 is hardly applied to the conveyance robot 20 and thus, the fixed state of the conveyance robot 20 to the fixing table or the fixing plate may be easily released. Further, even when the fixed state of the conveyance robot 20 to the fixing table or the fixing plate is released, the conveyance robot 20 is connected with the holding arms 45 through the connecting components 55 and the tip end components 54. Thus, the conveyance robot 20 does not fall down and thus, the safety of the worker can be secured.

At the next step S110, the entirety of the replacement apparatus 40 is drawn out of the loader module 13 and the holding arms 45 are moved back from the inside of the loader module 13. In this case, when the roller 85 is locked, the locking thereof is released. Also, in the operation at step S110, the replacement apparatus 40 may be immediately drawn out in the X-direction in such a way that the positioning unit 42 fixed to the LM frame 91 guides the guide rails 47. When the replacement apparatus 40 is drawn out, finally, the positioning unit 42 abuts against the tip ends of the guide rails 47 and the magnets 84 are removed from the LM frame 91 by an inertia force at the time when the replacement apparatus 40 is drawn out. With the configuration as described above, the conveyance robot 20 is carried out of the inside of the loader module 13 in a stable state in which the conveyance robot is suspended supported on the holding arm 45. The carrying-out work may be safely performed without causing the conveyance robot 20 to collide with, for example, the wall part of the loader module 13 due to the shaking of the conveyance robot 20 during the carrying-out work as in the related art. Further, since the replacement apparatus 40 may be operated by a single worker without requiring a plurality of workers as in the related art, there is an advantage in that an accident, which is caused by a linkage mistake between the works, does not occur and the operation may be finished within a short period of time.

In the meantime, in the exemplary embodiment described above, although an operation of changing the height of the holding arms 45 is not performed when the entirety of the replacement apparatus 40 is drawn out of the loader module 13, this is on the premise that even though the height of the holding arms 45 is not changed, the suspended and supported conveyance robot 20 does not collide with the LM frame 91.

Whereas, the conveyance robot 20 may presumably have a structure that the lower part of the conveyance robot 20 collides with the LM frame 91 when the carrying-out operation at step S110 is performed without changing the height of the holding arms 45. In a case where carrying-in/-out of such a conveyance robot 20 with respect to the loader module 13 is performed as described above, the operation at step S110 is performed after the holding arms 45 are elevated to a predetermined height so as to arrange the suspended and supported conveyance robot in a state where it does not collide with the LM frame 91 after the actual fixation operation at step S109 is performed.

The above-mentioned exemplary embodiment is based on a configuration that enables carrying-out of the conveyance robot by straightly moving back and forth the replacement apparatus 40 with respect to the loader module 13 in the X-direction in a state where the positioning of the replacement apparatus 40 with respect to the carry-in/out port is performed by the positioning unit 42.

However, a certain semiconductor manufacturing apparatus may include various members such as various wirings and pipes, a motor, and a power supply that are placed in the loader module or the load port. In such a case, it may be unable to form a carry-in/out port such that the conveyance robot 20 is always carried in/out therethrough merely by straightly moving back and forth the replacement apparatus 40 in the X-direction, due to a problem about space.

However, even in such a case, it goes without saying that the carry-in/out port is required to have an enough width that allows the conveyance robot 20 suspended and supported on the holding arms 45 to be carried in or carried out therethrough by moving back and forth the holding arms 45 of the replacement apparatus 40. Accordingly, in such a case, the positions of the holding arms 45 in the Y-direction are adjusted to the positions where the holding arms 45 may be aligned with the position of the carry-in/out port in a state where the position of the replacement apparatus 40 is determined by the positioning unit 42, and then the holding arms 45 are put into the loader module. Also, the positions of the holding arms 45 in the Y-direction are adjusted again to be aligned with the position of the conveyance robot and a series of operations at steps S106 to S109 from the temporal fixation to the actual fixation are performed. Thereafter, the positions of the holding arms 45 in the Y-direction are adjusted again to the position where the holding arms 45 may be moved back from the loader module so as to move back the holding arms 45, on which the conveyance robot is suspended and supported, from the loader module.

The operations of carrying the conveyance robot 20 into the loader module 13 using the replacement apparatus 40, fixing the conveyance robot 20 at a predetermined position within the loader module 13, and then drawing out the replacement apparatus 40 may be performed substantially in a reverse order of the operations of carrying out the conveyance robot 20 from the loader module 13 as described above. The operations will be briefly described below.

Figure 11:
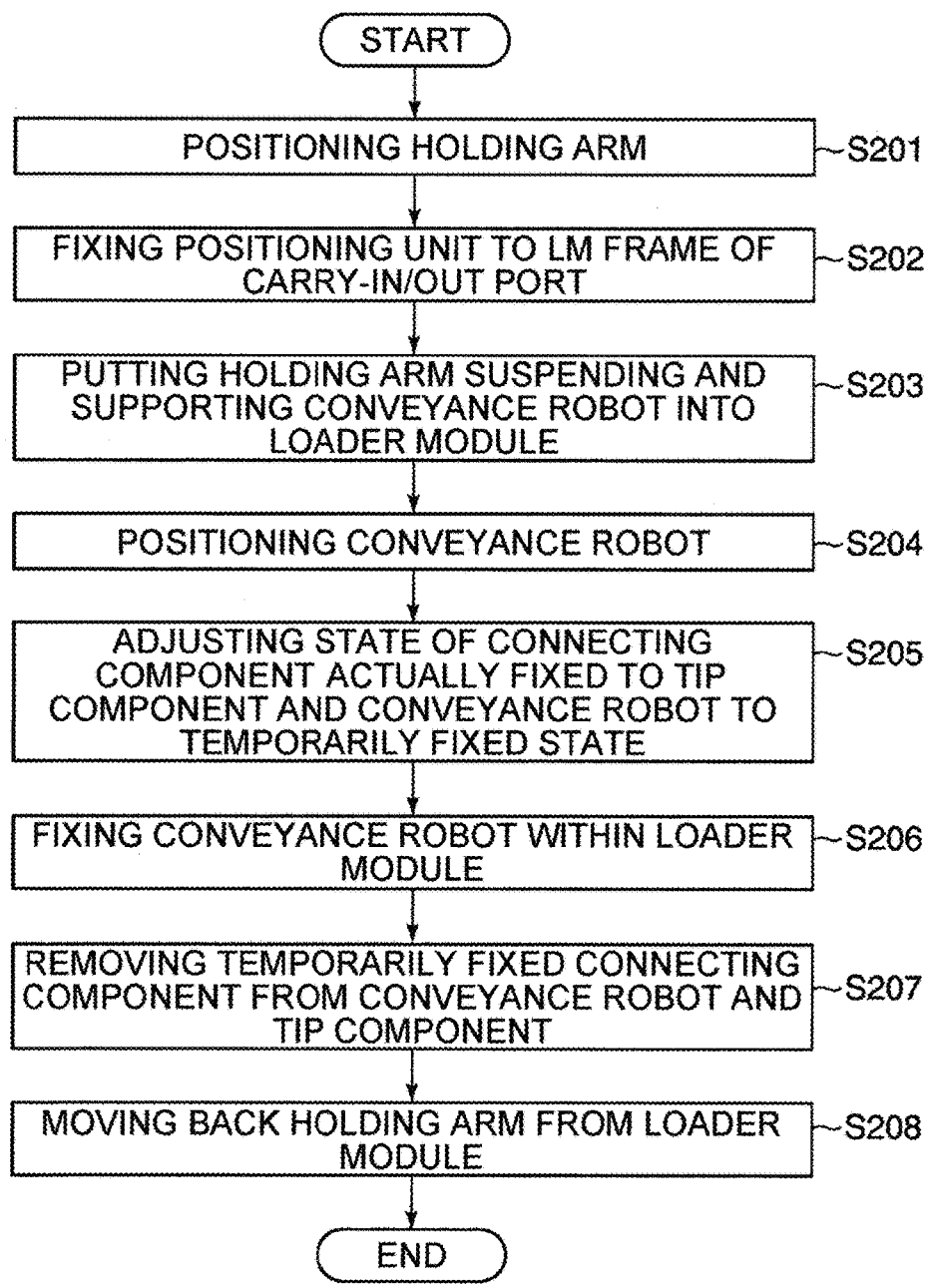
FIG. 11 is a flowchart illustrating an operational sequence of a process of carrying the conveyance robot into a loader module of the semiconductor manufacturing apparatus of FIG. 1 using the replacement apparatus of FIG. 3.

FIG. 11 is a flowchart illustrating an operational sequence of a process of carrying the conveyance robot 20 into the loader module 13 using the replacement apparatus 40. In the meantime, the conveyance robot 20 is held the holding arms 45 at the time when the carrying-in operation of the conveyance robot 20 is started, and the state at that time is substantially the same as the state where the holding arms 45 were moved back from the loader module 13 at step S110.

At step S201, the positions of the holding arms 45 in each of the X-direction, Y-direction, and Z-direction are set to be same as those of step S103. At step S202, the positioning unit 42 is fixed to the LM frame 91, similarly to step S104. At step S203, the holding arms 45, on which the conveyance robot 20 is suspended and supported, are put into the loader module 13. At step S204, the position of the conveyance robot 20 is aligned with the position where the conveyance robot 20 is fixed within the loader module 13.

At step S205, a state where the tip end components 54 and the connecting components 55 are actually fixed by the first bolts 61 is adjusted to a temporarily fixed state. Further, a state where the connecting components 55 and the conveyance robot 20 are temporarily fixed by the second bolts 62 is adjusted to a temporarily fixed state. At step S206, the conveyance robot 20 is fixed in the loader module 13. At step S207, the temporarily fixed first and second bolts 61 and 62 are unscrewed so as to remove the connecting components 55 from the tip end components 54 and the conveyance robot 20. At step S208, the holding arms 45 are moved back from the loader module 13. With the configuration as described above, the operation of carrying the conveyance robot 20 into the loader module 13 is terminated. In the meantime, the detached connecting components 55 may be attached to the holding arms 45 so as to prevent the missing of the components.

Until now, although the exemplary embodiments of the present disclosure have been described, the present disclosure is not limited thereto. For example, in the exemplary embodiments, the conveyance robot 20 has been described as a fixed type robot, but may include a movable type robot capable of being moved in the Y-direction without being limited thereto. In this case, the conveyance robot is replaced with another conveyance robot by the replacement apparatus 40 after the conveyance robot is stopped at a predetermined position in the Y-direction to be in a non-movable state.

Further, in the exemplary embodiments, the magnets 84 are provided on the positioning unit 42 to be adhered to the LM frame 91 in order to determine the position of the positioning unit 42 with respect to the LM frame 91. However, the same function may be implemented even if, for example, a sucker or a latching mechanism is used instead of the magnets 84. Further, the processing target object is not limited to a wafer W, and the present disclosure may be applied to various manufacturing apparatuses having the same structure as that of the loader module 13 of the semiconductor manufacturing apparatus 10.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A conveyance robot replacement apparatus used for replacing a conveyance robot installed in a chamber of a semiconductor manufacturing apparatus in order to convey a substrate, the apparatus comprising:
    a positioning unit configured to perform positioning of the conveyance robot replacement apparatus with respect to the chamber;
    a holding unit configured to suspend and support the conveyance robot;
    a guide portion configured to guide forward/backward movements of the holding unit with respect to the chamber and is engaged with the positioning unit;
    a position adjustment unit configured to move the holding unit in each of longitudinal, horizontal, and vertical directions to adjust a position of the holding unit; and
    a connecting component connectable to the holding unit as well as to the conveyance robot,
    wherein the connecting component connects to the conveyance robot and connects with a tip end of the holding unit such that the holding unit suspends and supports the conveyance robot.

2. The apparatus of claim 1, wherein the tip end of the holding unit includes a tip end component connected with the connecting component, and
    the tip end component is rotatably attached to a tip end portion of the holding unit so as to make an angle of the tip end component with respect to the horizontal direction coincident with an angle of the connecting component connected to the conveyance robot.

3. The apparatus of claim 1, wherein the position adjustment unit includes a scale and a marker that assist adjustment of the position of the holding unit in each of the longitudinal, horizontal, and vertical directions.

4. The apparatus of claim 1, wherein the positioning unit includes an attachment mechanism, and
    the attachment mechanism is configured to attach to a frame located in the chamber such that a relative position of the positioning unit does not change with respect to the chamber.

5. The apparatus of claim 4, wherein the positioning unit includes an engagement fixture engaged with a projection portion formed on the frame located in the chamber, and
    the attachment mechanism attaches to the frame in a case where the engagement fixture is engaged with the projection portion when the conveyance robot replacement apparatus is moved toward the chamber such that the engagement fixture is engaged with the projection portion.

6. The apparatus of claim 4, wherein the attachment mechanism is any one of a magnet, a sucker, and a latching mechanism.

7. A conveyance robot replacement method of replacing a conveyance robot attached in a chamber of a semiconductor manufacturing apparatus in order to convey a substrate using a conveyance robot replacement apparatus, the method comprising:
    engaging a connecting component to the conveyance robot attached in the chamber;
    positioning a holding unit that suspends and supports the conveyance robot in the conveyance robot replacement apparatus;
    guiding a direction of forward/backward movements of the holding unit with respect to the chamber;
    putting a tip end of the holding unit into the chamber to access the connecting component;
    engaging the connecting component to the tip end of the holding unit;
    releasing attachment of the conveyance robot in the chamber;
    securing the connecting component to the conveyance robot and securing the connecting component to the holding unit; and
    drawing out the holding unit that suspends and supports the conveyance robot from the chamber.

8. The conveyance robot replacement method of claim 7, wherein the step of guiding the direction of forward/backward movements of the holding unit with respect to the chamber further comprises attaching a positioning unit which is linearly slidable along a guide rail provided in the conveyance robot replacement apparatus to a frame located in the chamber.

9. The conveyance robot replacement method of claim 8, wherein the positioning unit includes an attachment mechanism, and
    the attachment mechanism is configured to attach to the frame located in the chamber such that a relative position of the positioning unit does not change with respect to the chamber.

10. The conveyance robot replacement method of claim 9, wherein the attachment mechanism is any one of a magnet, a sucker, and a latching mechanism.

11. A conveyance robot replacement method of replacing a conveyance robot attached in a chamber of a semiconductor manufacturing apparatus in order to convey a substrate using a conveyance robot replacement apparatus, the method comprising:
    positioning a holding unit in a state where the holding unit suspends and supports the conveyance robot by connecting a connecting component in the conveyance robot replacement apparatus to the conveyance robot and to the holding unit;
    guiding a direction of backward/forward movements of the holding unit with respect to the chamber;

positioning the conveyance robot to a predetermined position within the chamber by putting the holding unit that suspends and supports the conveyance robot into the chamber;

adjusting the connection between the conveyance robot and the connecting component while the connecting component remains engaged to the conveyance robot and adjusting the connection between the conveyance robot and the holding unit while the connecting component remains engaged to the holding unit;

attaching the conveyance robot to a predetermined position within the chamber; and removing the connecting component from the conveyance robot and the holding unit, and retreating the holding unit from the chamber.

* * * * *